United States Patent [19]

Spatrisano et al.

[11] Patent Number: 4,926,547
[45] Date of Patent: May 22, 1990

[54] METHOD FOR MANUFACTURING A MODULAR SEMICONDUCTOR POWER DEVICE

[75] Inventors: Antonio P. Spatrisano, Palermo; Luciano Gandolfi, Corsico; Carlo Minotti, Catania; Natale Di Cristina, Palermo, all of Italy

[73] Assignee: SGS-Thomson Microelectronics S.p.A., Catania, Italy

[21] Appl. No.: 373,647

[22] Filed: Jun. 27, 1989

Related U.S. Application Data

[63] Continuation of Ser. No. 160,630, Feb. 26, 1988, abandoned.

[30] Foreign Application Priority Data

Mar. 9, 1987 [IT] Italy ............................ 19630 A/87

[51] Int. Cl.[5] .................................. H05K 3/34
[52] U.S. Cl. .............................. 29/841; 29/832
[58] Field of Search ............ 29/827, 832, 840, 841; 357/72, 74, 75, 80, 81

[56] References Cited

U.S. PATENT DOCUMENTS

| | | | |
|---|---|---|---|
| 4,518,982 | 5/1985 | Du Bois et al. | 357/81 |
| 4,675,989 | 6/1987 | Galloway et al. | 29/827 X |
| 4,722,060 | 1/1988 | Quinn et al. | 29/827 X |
| 4,783,428 | 11/1988 | Kalfus | 357/81 |
| 4,807,018 | 2/1989 | Cellai | 357/81 |

FOREIGN PATENT DOCUMENTS

| | | |
|---|---|---|
| 282124 | 9/1988 | European Pat. Off. . |
| 3336979 | 4/1984 | Fed. Rep. of Germany . |
| 3516995 | 11/1985 | Fed. Rep. of Germany . |
| 2495376 | 6/1982 | France . |
| 1255073 | 11/1971 | United Kingdom . |
| 2099742 | 12/1982 | United Kingdom . |

Primary Examiner—Joseph M. Gorski
Assistant Examiner—Peter Vo
Attorney, Agent, or Firm—Herbert Dubno

[57] ABSTRACT

The components used in the method comprise a heat-dissipating base plate, one or more three-layer plates (the top layer consisting of copper plates and strips) and a one-piece frame designed to constitute the terminals. After the chips have been soldered onto the upper plates and connected to the strips, the inner ends of the frame are soldered to points of connection with the chips. This is followed by the encapsulation in resin and the shearing of the outer portions of the frame, which, during the process, serve to temporarily connect the terminals.

6 Claims, 3 Drawing Sheets

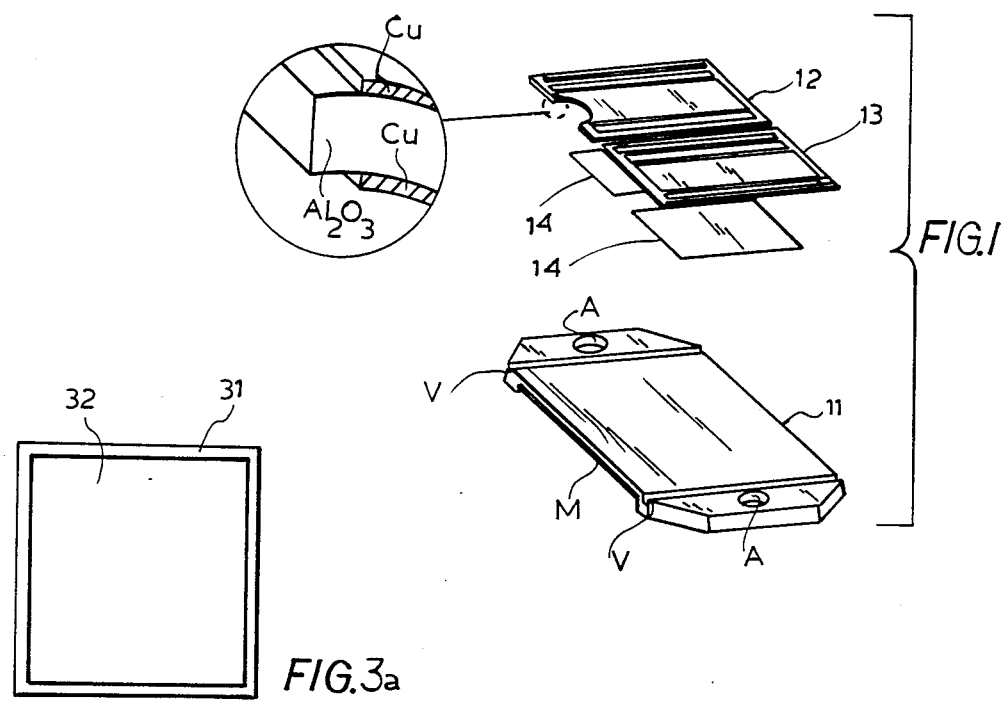
FIG.1
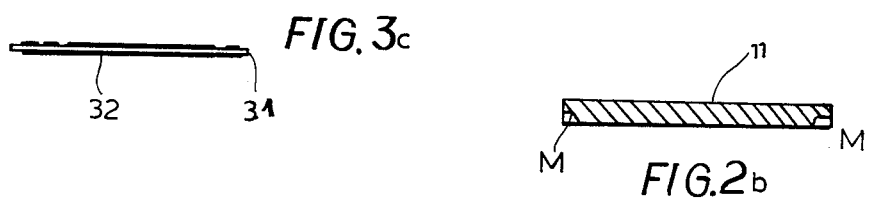
FIG.3a
FIG.3c
FIG.2b
FIG.2a
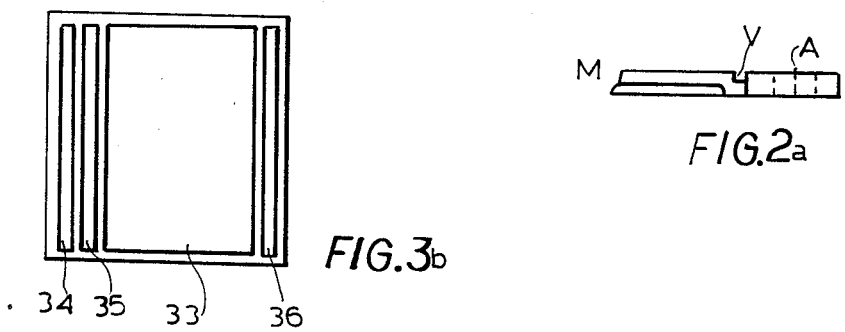
FIG.3b

METHOD FOR MANUFACTURING A MODULAR SEMICONDUCTOR POWER DEVICE

This is a continuation of co-pending application Ser. No. 07/160,630 filed on 26 Feb. 1988 now abandoned.

FIELD OF THE INVENTION

The present invention relates to a method of manufacturing a modular semiconductor power device and to a device as obtained by such method.

BACKGROUND OF THE INVENTION

In the manufacture of modular semiconductor power devices, as in the manufacture of numerous other components, an important target is to produce extremely reliable products using sample and inexpensive procedures.

The known semiconductor power devices involve complex and costly procedures, both from the point of view of the individual components necessary for constructing them and from the standpoint of their assembly and reciprocal insulation.

Some of these known devices are described in U.S. Pat. No. 4,518,982. This patent gives a detailed description of a modular power device whose manufacturing process consists of soldering one or more semiconductor chips onto a flat portion of a first electrode (which also serves as a heat sink), soldering other electrodes (possibly containing other chips) onto the flat portion by means of a dielectric adhesive material, electrically connecting the various chips and electrodes, encapsulating the device in resin, and electrically insulating the heat dissipating surface by means of a further layer of insulating material.

OBJECT OF THE INVENTION

The object of this invention is to provide a particularly reliable modular power device obtained by means of an extremely simple and not very expensive assembly procedure, according to a highly flexible manufacturing method and with components which, although extremely limited in number, can be used to create various circuit arrangements and layouts, always using the same tools and always maintainins an identical external geometrical configuration of the devices obtained.

SUMMARY OF THE INVENTION

According to a particular feature of the manufacturing method, the reciprocal insulated of the electrodes and their encapsulation are carried out in a single step. The manufacturing method according to the invention for making a modular semiconductor power device comprising one or more semiconductor chips, a metal plate for dissipating heat generated by the Joule effect, a plurality of electrodes constituting the signal and power terminals of the device, and a resin encapsulation, comprises soldering the chip or chips onto one or more plates of electrically conductive material;

positioning the plate or plates on a plane substantially parallel to the aforesaid heat dissipating plate and close to the latter;

blanking, from a single sheet of conductive material, a one-piece frame designed to constitute the power and signal terminals, the blanking enabling temporary connections to be kept between the portions of the terminal conductors designed to remain outside of the resin encapsulation;

soldering the inner ends of the terminals to points arranged for the connection to the aforesaid chips;

encapsulating with insulting resin all the active parts of the device, leaving uncovered the outer surface of the plate and the portions of the terminals involved with the aforesaid temporary connections; and shearing the temporary connections.

Each sheet can be made of copper and that the latter, before the chips are soldered onto it, can be placed in a plate consisting of three layers soldered directly onto each other, in which the first layer is made up of the sheet and copper strips insulated from the sheet itself. The intermediate consists of an alumina plate and the third layer consists of a sheet of copper substantially equal in size or slightly smaller than the intermediate layer. The aforesaid points of connection are situated on the aforesaid sheets and strips, the soldering of the inner ends of the terminals to the aforesaid points is preceded by the soldering of wires connecting the chips to the aforesaid strips.

The sheet can be soldered onto the internal surface of the plate and the connections between chips and strips can be made by means of ultrasound soldering of aluminum wires.

The aforesaid points of connection with the chips can be located on the aforesaid sheets and on wettable metal coatings on the surface of the chips.

After blanking of the one-piece frame and before the aforesaid soldering of the inner ends of the terminals to the points of connection, the inner ends of the terminals can be bent in a direction perpendicular to the plane of the frame.

After the encapsulation and the shearing of the temporary connections of the one-piece frame, the terminals designed to perform the function of signal terminals can be bent in a direction perpendicular to the base plate, while the terminals designed to perform the function of power terminals can be bent over the capsule in a direction parallel to the base plate itself.

BRIEF DESCRIPTION OF THE DRAWINGS

The features of the invention will be more clearly evident from the following description and the accompanying drawing in which:

FIG. 1 is an exploded view of the base plate and the substrates supporting the chips:

FIGS. 2a and 2b, respectively, are a side view and a cross-sectional view of the base plate of FIG. 1;

FIGS. 3a, 3b and 3c, respectively, are bottom, top and cross-sectional views of a substrate of FIG. 1;

SPECIFIC DESCRIPTION

Figure 6:
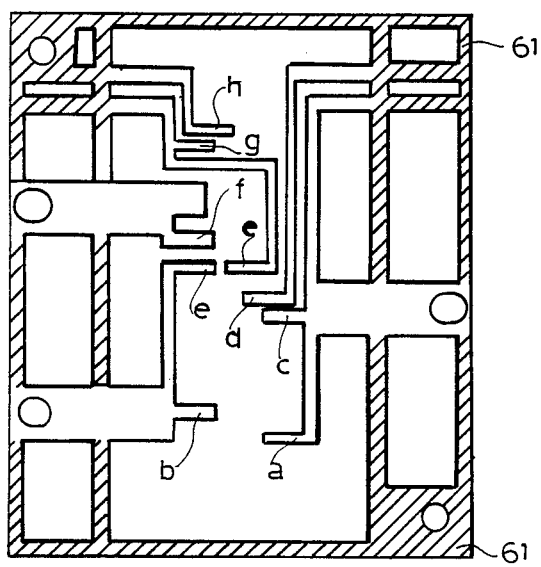
FIG. 6 is a plan view of the flattened frame from which the frame of FIG. 5 was obtained.

In FIG. 1 the base plate 11 of the device acts as a heat sink as well as a support and fastener for the device itself. It is made of heat-conductive metal with high mechanical strength. The holes A in it serve to secure it, by means of screws, onto the external heat spreader, while the grooves V serve to absorb any possible deformation of the base plate due to the high tightening torque, thereby preventing them from being transmitted to the central portion of the plate.

The S-shaped recesses M, on the sides (see the side and cross-sectional views of the plate shown in FIGS. 2a and 2b serve to ensure a better adhesion of the subsequently applied resin encapsulation, as is explained more clearly further on with reference to FIG. 8b.

FIG. 1 also shows the components 12 and 13, which are two chip-supporting substrates, which are soldered onto the base plate 11 by means of the layers of solder 14.

As illustrated in FIGS. 3a, 3b and 3c (bottom, top and cross-sectional views of a substrate) each substrate is composed of a quadrangular-shaped thin medial layer 31 of alumina (less than 1 mm thick), with thin copper plates soldered directly onto its two lateral faces. More precisely, soldered onto the face destined to lie facing the upper face of the base plate 11 is a single copper plate 32, which is also quadrangular in shape but with slightly smaller dimensions than those of the layer of alumina, while the other face is provided with a rectangular plate 33, for supporting the chips and for the connections with an external electrode, and, on either side of said plate 33, narrower plates (lateral strips) 34, 35 and 36 designed both for soldering the conductor for connection with the chips, and for soldering other external electrodes.

Figure 4:
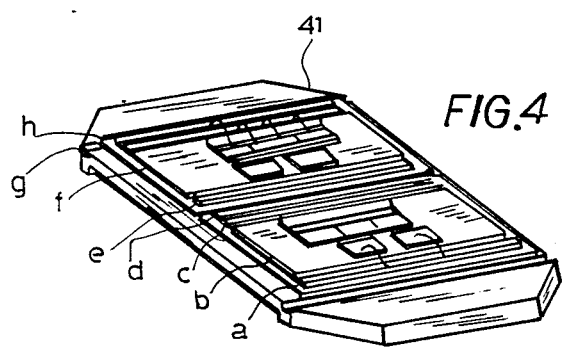
FIG. 4 is a view of the base plate of FIG. 1 after the substrates and the chips have been joined to it, and after the electrical connections between chips and metal coating of the substrates have been made.

FIG. 4 shows the device 41 as it appears after the two substrate have been soldered onto the base plate, the chips have been soldered onto the larger upper copper plates b and f, and the electrical connections have been carried out between the chips and the lateral strips a, c, d, e, g, h. The latter connections are obtained by ultrasonic soldering with aluminum wire.

Figure 5:
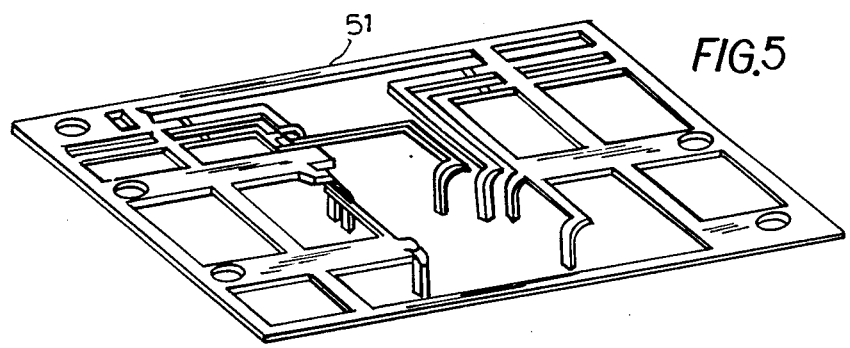
FIG. 5 is a perspective view of the one-piece frame for obtaining the external terminals and their connections with the metal-coating of the substrates.

FIG. 5 shows a copper frame 51 designed to constitute the external terminals and the connections of the latter with the lateral strips and the plates f and b of FIG. 4. The frame of FIG. 5 is obtained by blanking from a copper sheet and by subsequently bending the terminal portions downwards, said terminal portions being subsequently soldered onto the lateral strips and the plates f and b.

FIG. 6 shows a plan view of the frame of FIG. 5, as it appears after being blanked from the copper sheet and before the bending of the terminal portions, which are indicated respectively by h, g, e, d, c, a, f, b. After being bent downwards, the terminal portions are then soldered respectively onto the strips h, g, e, d, c, a, and onto the plates f and b of 41. After the frame 51 has been soldered onto the device 41, the device is encapsulated by means of a molding process with insulting resin (e.g. thermosetting epoxy resin), preferably of the low-stress type.

Figure 7:
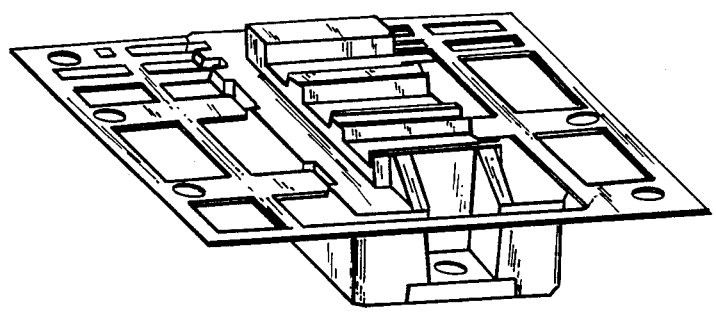
FIG. 7 is a perspective view of the modular device after the resin encapsulation has been carried out by molding.

After the moldings phase, the device has the appearance shown in FIG. 7 At this point, in order to complete complete the device, it is necessary to shear the external temporary connections between the terminals, corresponding to the portions 61 illustrated in dotted lines in FIG. 6, and then bend the signal terminals upwards to a vertical position, and the power terminals inwards.

Figure 8A:
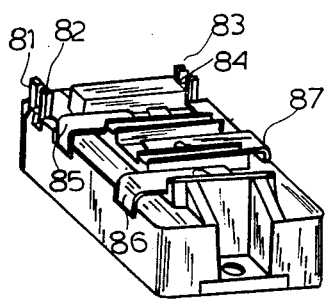
FIGS. 8a, 8b and 8c are respective perspective top and bottom views and a plan view of the finished device.
Figure 8B:
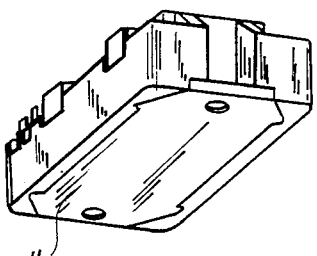

The finished device takes on the appearance of FIG. 8a (top perspective view) and of FIG. 8b (bottom perspective view), in which 81, 82, 83 and 84 indicate the signal terminals and 85, 86 and 87 indicate the power terminals.

As shown in FIG. 8b, the resin encapsulation ends, from below, flush with the lower surface of the base plate 11, which can consequently be secured in direct contact with the supporting metal structure on which it is designed to be placed, thereby ensuring efficient dissipation of the heat. The same figure clearly shows the function of the S-shaped recesses M on the base plate (see FIGS. 1 and 2b). In fact, on completion of the device, they are completely embedded in the resin body, so as to constitute two areas for anchoring and ensuring an efficient grip of the resin.

Figure 8C:
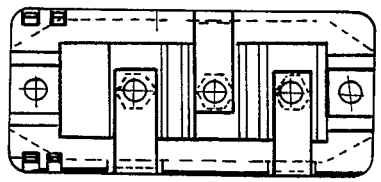

As shown in FIG. 8c (plan view of the device), after the bending, the terminal holes of the three power terminals 85, 86 and 87 come to rest exactly above the three hexagonal nuts embedded in the resin, so as to enable the electrical connection with the external connecting rods.

The foregoing description gives a clear idea both of the versatility of the method of the invention and of the simplicity of the assembling procedure. In fact, it is clear that:

- with the substrates of FIG. 1 and FIG. 3, it is possible to use chips of different number and sizes, to achieve different connections of the chips with the lateral strips, and to obtain soldered strips with different geometrical layouts;
- the one-piece of FIG. 5 and FIG. 6 can also be made with different geometrical layouts, to enable it to adapt to the different geometrical layouts of the aforesaid soldered strips, and to the different electrical functions of the device;
- the procedures for soldering the conductors connecting the chips to the metal strips and the external electrodes to the metal chip-supporting strips or plates are simplified due to the flat disposition of the soldering points and to the fact that the inner ends of the electrodes are soldered when they are still firmly secured to each other by the aforesaid temporary connections; and
- due to the fact that the chips are soldered onto coplanar plates and to the presence of the temporary connections between the electrodes it is also possible to carry out the encapsulation and reciprocal insulation of the electrodes in a single step. A further advantage, in addition to those mentioned previously, is related to the particular structure of the substrate chosen for soldering the chips as well as that related to the type of resin used for the encapsulation. In fact, these substrates, which consist of a layer of alumina with copper plates soldered directly onto both faces, are characterized by thermal expansion coefficients very similar to those of silicon. This reduces to a minumum the thermomechanical stress which would otherwise be transmitted to the chips due to the differential expansion of silicon and copper (other embodiments envisage the insertion, between the chips and the supporting copper plates, of layers of material, such as for example molybdenum, having an expansion coefficient lying half way between those of silicon and copper, which however complicate the assembling and lower the thermal performance).

The use of a low-stress type of resin helps to limit the stress transmitted to the chips even in the case of chips of very large dimensions.

It is also clear that numerous modifications, adjustments, variations and substitutions may be made to the embodiments previously described by way of example, always remaining within the spirit of this invention and its scope. For example, the wires connecting the chips to the metal strips of the substrates can be by direct soldering between the inner terminal portions of the one-piece frame and the chips, whenever the latter have wettable metal coatings. These internal portions can then be soldered to points (P) of connection with the chips situated on the aforesaid plates 33 and strips 34, 35, 36 (as in the case illustrated in FIGS. 4 and 5), or situated on the same plates and on wettable metal coatings on the surface of the chips.

Likewise, the chip-supporting substrates could have a different structure from that previously described and the insulation between the chips and the dissipator could be achieved by means of a layer of the encapsulating resin itself—which in this case should be of high thermal conductivity—instead of by a layer of alumina.

We claim:

1. A method of manufacturing a modular semiconductor power device, comprising the steps of:
   (a) welding semiconductor means including at least one semiconductor chip onto conductive-sheet means including at least one sheet of an electrically conductive material;
   (b) forming a power-device body by fixing said sheet to a member provided with a heat-dissipating metal plate for dissipating heat generated by the Joule effect and parallel to and close to said heat-dissipating plate;
   (c) blanking from a single sheet of conductive material a one-piece frame formed with strips adapted to form signal and power terminals of said device and with temporary connections between outer ends of said strips;
   (d) soldering inner ends of said strips selectively to points of said conductive sheet means connected with said semiconductor means or to said semiconductor means;
   (e) encapsulating at least active parts of said body and said inner ends of said strips with an insulating resin and leaving said outer ends of said strips and an outer surface of said plate uncovered by said resin; and
   (f) shearing said temporary connections from said strips.

2. The method defined in claim 1 wherein said conductor sheet means comprises a plurality of sheet members composed of copper, said sheet means being disposed on a face of an intermediate layer formed with an alumina plate, and a further sheet of copper of a size at most equal to that of the intermediate layer and disposed on another face of said intermediate layer, said inner ends of said strips being soldered to said sheet members and a plurality of chips forming said semiconductor means and connected with wires soldered to said sheet members.

3. The method defined in claim 2 wherein said further sheet is soldered to a surface of said heat-dissipating metal plate opposite said outer surface, connections between said chips and said sheet members being made by ultrasonic soldering of aluminum wires.

4. The method defined in claim 1 wherein said inner ends are selectively connected to wettable metal coatings on surfaces of chips forming said semiconductor means.

5. The method defined in claim 1 wherein, after blanking of said one-piece frame and prior to the soldering of said inner ends of said strips, said inner ends of said strips are bent in a direction perpendicular to a plane of said frame.

6. The method defined in claim 1 wherein, after encapsulation and shearing of said temporary connections, selected ones of said strips adapted to form signal terminals are bent in a direction perpendicular to said base plate while others of said strips adapted to form power terminals are bent over the encapsulating resin in a direction parallel to said base plate.

* * * * *

UNITED STATES PATENT AND TRADEMARK OFFICE
CERTIFICATE OF CORRECTION

PATENT NO. : 4,926,547

DATED : 22 May 1990

INVENTOR(S) : Antonio PERNICIARO SPATRISANO et al

It is certified that error appears in the above-identified patent and that said Letters Patent is hereby corrected as shown below:

On the title page, in items [19] and [75] please correct the inventor's last name to read:

--PERNICIARO SPATRISANO--.

Signed and Sealed this

Thirtieth Day of June, 1992

Attest:

DOUGLAS B. COMER

*Attesting Officer*    *Acting Commissioner of Patents and Trademarks*